July 25, 1967 H. T. HOCHMAN 3,333,166

SEMICONDUCTOR CIRCUIT COMPLEX HAVING LOW ISOLATION CAPACITANCE AND METHOD OF MANUFACTURING SAME

Filed June 23, 1964 d2(FIG.4)>d1(FIG.2)

INVENTOR
HERSCHEL T. HOCHMAN

BY Louis A. Kline
John J. Callahan

HIS ATTORNEYS 3,333,166
Patented July 25, 1967

3,333,166

SEMICONDUCTOR CIRCUIT COMPLEX HAVING LOW ISOLATION CAPACITANCE AND METHOD OF MANUFACTURING SAME

Herschel T. Hochman, Dayton, Ohio, assignor to The National Cash Register Company, Dayton, Ohio, a corporation of Maryland Filed June 23, 1964, Ser. No. 377,311
3 Claims. (Cl. 317—235)

This invention relates to an improvement in the structure and method of manufacturing semiconductor complexes, of the type having a plurality of zones of semiconducting material electrically isolated from each other by P-N junctions, which provides decreased isolation capacitance, particularly of the isolation regions in semiconducting material such as silicon.

In the art, there has been disclosed a semiconductor circuit complex comprising a semiconductor slice having a plurality of regions of alternating P and N conductivity types to thereby provide a plurality of P-N junctions. Semiconducting components are assembled on selected regions of the slice. The components are separated by a plurality of the regions so as to provide therebetween at least two P-N junctions, thereby achieving electric insulation of the components through the slice by the impedance of the P-N junctions; e.g., Kurt Lehovec's United States Patent No. 3,029,366, issued Apr. 10, 1962.

Also, in the art, there has been disclosed a semiconductor circuit complex comprising a monocrystalline wafer of semiconducting material having selected donor and acceptor impurities dispersed in separate zones therein and defining a checkerboard of alternate P-type and N-type semiconducting zones extending transversely through the wafer to isolate zones of one polarity from other zones of like polarity; e.g., Robert N. Noyce's United States Patent No. 3,117,260, issued Jan. 7, 1964.

The present invention is directed, in particular, to a semiconductor circuit complex of the type formed as a substrata wafer of semiconducting material of a first polarity or conductivity, and an epitaxially grown body or film of semiconducting material of an opposite polarity or conductivity deposited thereon.

In the manufacture of the above type of semiconductor circuit complex, it is known practice to divide the epitaxially grown body into zones by barriers of semiconducting material of the same polarity as that of the substrata wafer to provide large area oppositely oriented P-N junctions between the zones. The P-N junctions provide for electrical isolation of the zones from each other. When the proper bias is placed on these junctions, they operate to prevent current flow between semiconducting components fabricated in the zones. Accordingly, interaction between the various semiconducting components is substantially inhibited, thereby reducing some of the parasitic effects experienced in these semiconductor circuit complexes.

One known manner in which to accomplish the formation of the above-noted barriers and isolation junctions is to diffuse an impurity of the same polarity as that of the substrata wafer from the surface of the epitaxially grown body into selected regions thereof to a depth meeting the substrata wafer. The diffused impurity, though of the same type of impurity as that of the substrata wafer, is of heavier concentration. All of the junctions found in the semiconductor circuit complex at this stage in the fabrication thereof, including the isolation junctions, obey the normal diode equations for capacitance and current flow. The isolation junctions are of large area and have associated therewith high total isolation capacitance, which tends to degrade the semiconductor circuit complex in terms of both speed and performance. It is therefore desirable that the high total isolation capacitance associated with the isolation junctions be substantially reduced. The desirability of this reduction in isolation capacitance becomes even more critical in cases where circuit characteristics require a fairly high impurity concentration in the epitaxially grown body as well as in large area components such as resistors and capacitors, creating a considerably higher total isolation capacitance.

Accordingly, it is an object of the present invention to provide an improved method of manufacturing semiconductor circuit complexes having electrical isolation junctions of relatively low capacitance.

It is another object of the present invention to provide a method of decreasing the total isolation capacitance of a semiconductor circuit complex, particularly of the electrical isolation regions in a silicon semiconductor circuit complex.

It is a further object of the present invention to provide a semiconductor circuit complex having electrical isolation junctions of relatively low capacitance.

It is a further object of the present invention to provide a semiconductor circuit complex including a body of semiconducting material having a plurality of semiconducting zones electrically isolated from each other by barriers of semiconducting material of a polarity that is opposite to that of the zones, the barriers comprising a middle region having a higher impurity concentration than the body, and side regions having an impurity concentration less than that of the middle region but greater than that of the body.

In accordance with the method of the present invention, in the manufacture of a semiconductor circuit complex including a body of semiconducting material of a first polarity, where the body is divided into zones by barriers of semiconducting material of an opposite polarity having a higher impurity concentration than that of said body providing large area oppositely oriented P-N junctions for electrical isolation of the zones from each other with their associated high total isolation capacitance, the high total isolation capacitance is substantially decreased by diffusing an impurity of the opposite polarity into a region of the zones contiguous to the barriers to form additional barrier regions having an impurity concentration less than that of the barriers but greater than that of the zones, thereby forming new P-N junctions at least in areas of the original P-N junctions having the highest capacitance per unit area.

Also, in accordance with the present invention, a semiconductor circuit complex includes a body of semiconducting material of a first polarity divided into zones by barriers of semiconducting material of an opposite polarity, the barriers comprising a middle region having a higher impurity concentration than that of the zones, and side regions having an impurity concentration less than that of the middle region whereby oppositely oriented P-N junctions of high resistivity are provided for electrical isolation of the zones from each other.

Other and more specific objects of the present invention will become apparent from a consideration of the following description taken in conjunction with the accompanying drawing, which is presented by way of example only and is not intended as a limitation upon the novel features of this invention, which are set forth in the appended claims.

Figure 5:
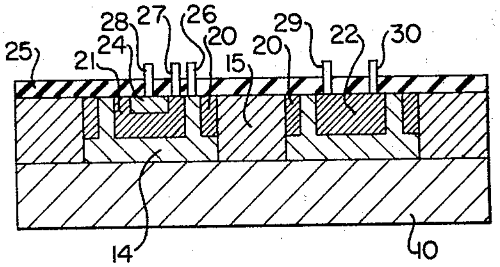
Figure 6:
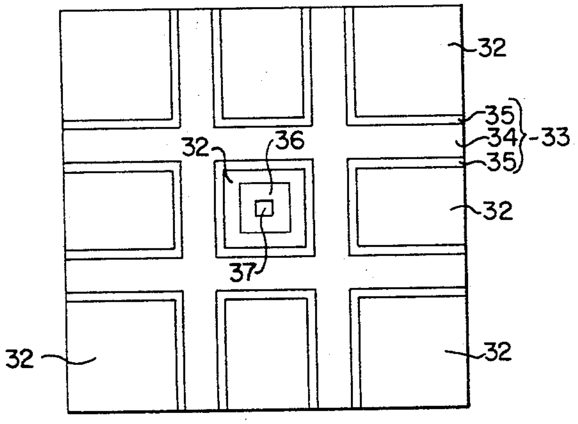

FIG. 5 is a cross-sectional view of a semiconductor circuit complex formed in accordance with the present invention and including modification of regions therein together with contacts illustrative of certain electrical circuitry which may be formed with the complex hereof; and FIG. 6 is a schematic illustration in plan view of one preferred embodiment of the semiconductor circuit complex of the present invention.

The substrata wafer 10 has an impurity concentration of about $5\times10^{14}$ to $10^{16}$ per cubic centimeter and a resistivity of about 30 to 1.0 ohm-centimeter. It is of P-type polarity in that a boron impurity, or other group III impurity, is added to the silicon to contribute an excess of free holes to the crystal structure of the silicon. The body 11 has an impurity concentration of about $10^{16}$ to $10^{17}$ per cubic centimeter and a resistivity of about 0.6 to 0.1 ohm-centimeter. It is of N-type polarity in that a phosphorus impurity, or other group V impurity, is added to the silicon to contribute an excess of free electrons to the crystal structure of the silicon. A coating 12, of silicon oxide, for example, covers the upper surface of the body 11.

The substrata wafer 10 is obtained from a single crystal of silicon which was grown in the conventional manner. The epitaxially grown body or film 11 of silicon is deposited on the substrata wafer 10 by one of the various methods known in the art, as, for example, by vacuum evaporation of silicon onto the heated substrata wafer 10. The silicon oxide coating 12 is also formed by one of the various methods known in the art, as, for example, by exposure of the body 11 to moisture and air, or by utilization of an oxidizing agent such as hydrogen peroxide or the like.

Figure 1:
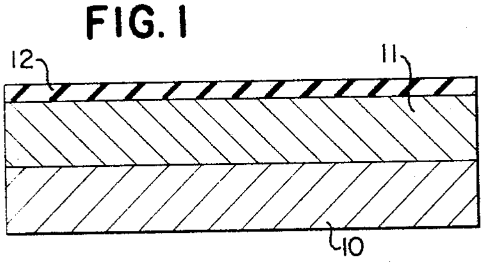
FIG. 1 is a cross-sectional view of a P-type silicon semiconductor wafer, an N-type epitaxially grown body or film of semiconducting material deposited on the wafer, and a silicon oxide coating over the surface of the body.
Figure 2:
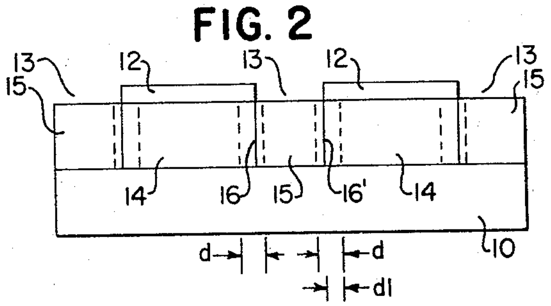
FIG. 2 is a cross-sectional view of the device of FIG. 1 after the diffusion of impurities into the body of semiconducting material for electrical isolation of regions of the body from each other by means of barriers of semiconducting materials.

In FIG. 2, the oxide coating 12 is formed into a mask by the production of a plurality of openings 13 therethrough. The removal of the oxide coating within the openings 13 may be accomplished by photoresist techniques or by etching, as, for example, with hydrofluoric acid. Following the production of the masked complex, it is the conventional practice to diffuse an impurity of the same polarity as that of the substrata wafer 10 into the body 11 from the surface areas thereof exposed by the openings 13 to a depth substantially joining the substrata wafer 10. This impurity is of heavier concentration than that of the substrata wafer 10. The foregoing diffusion step is undertaken to provide various electrically isolated zones 14 in the body 11. These zones 14 are of the same polarity material and are electrically isolated from one another by means of barriers 15 of opposite polarity material of high impurity concentration made by the foregoing diffusion step. With the foregoing configuration, there are established large area P-N junctions 16 and 16' on opposite sides of the barrier 15 and between each of the semiconducting zones 14. The opposite orientation of these P-N junctions provides a high resistance to current flow between adjacent regions 14. The barriers 15 have an impurity concentration of about $10^{20}$ cubic centimeter.

In accordance with the foregoing conventional practice, in order to achieve electrical isolation of the zones 14 from one another, it has been found necessary to diffuse a heavy concentration of impurity into the body 11 in order to isolate the various zones 14 from one another by means of the barriers 15. A disadvantage of the foregoing isolation technique is that a large accumulation of capacitance occurs, particularly near the surface of the silicon body 11, where the impurity concentration is the greatest. This capacitance occurs at the junctions 16 and 16' and is due to the difference in impurity concentration and types of semiconducting material on both sides thereof. This effect is analogous to a two-plate capacitor, and the capacitance is inversely related to the distance, $d$ (FIG. 2), between the space charge region $$C=\frac{EA}{d}$$

where $E$=dielectric for the material and $A$=junction area. Space charge widening will increase for a decrease in impurity concentration; therefore, one would expect in the normal isolation junction, as, for example, 16 or 16', where the zone 14 (N-type semiconducting material) on one side of the junction 16 has a relatively low impurity concentration with respect to the other side of the junction 16, substantially all space charge widening to occur in the region 14 as indicated at $d1$ in FIG. 2. This means that $d1$ in FIG. 2 would be at a minimum especially near the surface of the zone 14 and thus create large capacitances in the complex.

After the foregoing isolation diffusion step creating the barriers 15, an oxide coating is formed over the surface of the barriers 15 as well as being present over the surface of the zones 14.

Figure 3:
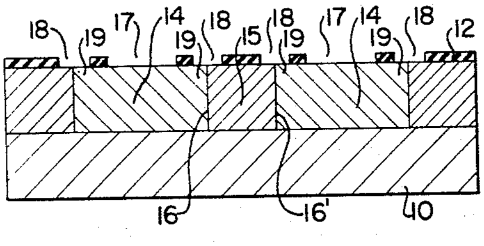
FIG. 3 is a cross-sectional view of the device of FIG. 2 after suitable openings are provided in the silicon oxide coating for the next diffusion process in accordance with the invention.
Figure 4:
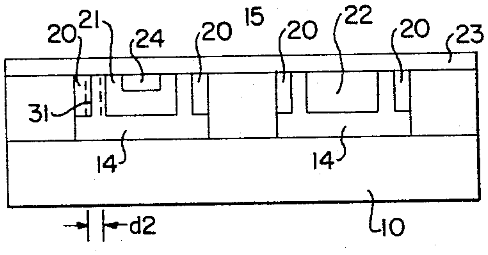
FIG. 4 is a cross-sectional view of the device of FIG. 3 after the diffusion of impurities into regions of the body zones contiguous to the barriers to provide additional barrier regions in accordance with this invention.

Referring now to FIG. 3, the oxide coating is once again formed into a mask by the production of a plurality of openings 17 and 18 therethrough. The openings 17 in the oxide coating are normally made in order to form various components in the zones 14 by means of a subsequent diffusing step. In accordance with the present invention, the openings 18 are also made in the oxide coating. These openings 18 are in alignment with the barriers 15, overlapping slightly the zones 14. Then, while an impurity of the same polarity as that of the barriers 15 and of a lower concentration with respect thereto is diffused into the zones 14 from the surface areas exposed by the openings 17, such impurity is also diffused into regions 19 of the zones 14 contiguous to the barriers 15 from the surface areas exposed by the openings 18 to form additional barrier zones 20 (FIG. 4). During this last diffusion step, no substantial amount of impurity enters the barriers 15, since it is of lower concentration than the impurity concentration of the barriers 15. However, where the openings 18 in the oxide coating overlap the zones 14, diffusion occurs to the same depth as the zones 21 and 22 of P-type semiconducting material. The additional barrier zones 20 have an impurity concentration of about $10^{18}$ cubic centimeter.

In FIG. 4, subsequent to the second diffusion step forming the additional barrier zones 20 and the zones 21 and 22, an oxide coating 23 is again formed over the surface of the circuit complex. Then, a further opening (not shown) is made in the coating 23, and through it an impurity of opposite polarity to that diffused into the zone 21 and of a higher concentration with respect to the impurity concentration of the zone 14 is diffused into the zone 21 to form a further zone 24.

After the formation of the zone 24, an oxide coating 25 again covers the surface of the circuit complex. Then, further openings are made therein to provide communication with the zones 14, 21, and 24 respectively corresponding to the collector, base, and emitter elements of a transistor, and to the zone 22 corresponding to a resistor element. Thus, an ohmic contact including an electrical lead 26 is provided in connection with the upper surface of the collector element 14. Another ohmic contact including an electric lead 27 is provided in connection with the upper surface of the base element 21, and a further ohmic contact including an electric lead 28 is provided atop the emitter element 24. The resistor element is completed by providing a pair of ohmic contacts including the electric leads 29 and 30 in connection with the upper surface of the resistor element 22.

With the formation of the additional barrier zones 20 in accordance with the present invention, there are now effectively created in the region 19 (FIG. 3), where the greatest capacitance existed in the prior-art circuit complex, junctions, such as the junction 31 (FIG. 4), having high resistivity material on both sides thereof, thereby increasing the space charge region (*d2*, FIG. 4) on the additional barrier zone 20 side (increasing the effective distance between plates) and reducing total isolation capacitance considerably.

What has been described is a method of decreasing the integrated circuit capacitance of a semiconductor circuit complex that need not involve diffusion steps additional to those now used in the art; that is, the additional barrier zones 20 (FIG. 4) may be formed at the same time that the base region 21 of a transistor device and the resistor region 22 of a resistor element are formed. The circuit frequency response and the operating speed of a semiconductor circuit complex are, in general, limited by the capacitance of the various regions; therefore, by this invention a significant increase in frequency response and therefore operating speed of the complex is achieved with the resultant lower total capacitance.

Although the above description of the method of decreasing isolation capacitance has been referenced to a semiconductor circuit complex of the type including a substrata wafer and an epitaxially grown body deposited thereon, it will be appreciated that it is equally applicable to semiconductor circuit complexes of the single-wafer type shown in United States Patent No. 3,117,260, previously referred to.

FIG. 6 is a plan view of a semiconductor circuit complex of the type shown in FIG. 5 including a substrata wafer and an epitaxially grown body deposited thereon. In addition, the body portion thereof is divided into a plurality of separate zones 32 (similar to the zones 14, FIGS. 2, 3, 4, and 5) by means of a diffused grid barrier 33. The grid barrier 33, in accordance with the present invention, includes a middle region 34 (similar to the barriers 15) having a higher impurity concentration than the zones 32, and narrower side regions 35 (similar to the additional barrier regions 20) having an impurity concentration less than that of the middle region 34. For illustrative purposes, the zone 32 in the middle of the complex has zones 36 and 37 formed therein (similar to the zones 21 and 24 of FIG. 5), which form the base and emitter elements of a transistor. It will now be appreciated that the grid barrier 33 of the present invention provides electrical isolation of the zones 32 from one another, thereby providing a semiconductor circuit complex of low total isolation capacitance.

While the fundamental novel features of the invention have been shown, described, and pointed out as applied to a preferred embodiment, it will be understood that various omissions, substitutions, and changes in the form and details of the illustrated device may be made by those skilled in the art without departing from the spirit of the invention. It is the intention, therefore, to be limited only as indicated by the scope of the following claims.

What is claimed is:

1. A semiconductor circuit complex comprising a substrata wafer of semiconducting material of a first polarity, and an epitaxially grown body of semiconducting material of an opposite polarity deposited on said substrata wafer, wherein said body of semiconducting material is divided into zones by barriers of semiconducting material of said first polarity, said zones containing a diffused region of said first polarity which extends only part way across the depth of said body, said barriers comprising a middle diffused region extending entirely across the depth of said body and contiguous side diffused regions which separate said middle diffused region from said adjacent zones and which extend substantially the same distance across the depth of said body as said diffused region contained in said zones, said side diffused regions having an impurity concentration less than that of said middle diffused region whereby oppositely oriented P-N junctions of high resistivity are provided for electrical isolation of said zones from each other, said P-N junctions providing less total isolation capacitance than P-N junctions formed by barriers devoid of said side diffused regions.

2. A semiconductor circuit complex comprising a substrata wafer of semiconducting material of a first polarity having a low impurity concentration; and an epitaxially grown film of semiconducting material of an opposite polarity concentration deposited on said substrata wafer and divided into separate zones by a grid of semiconducting material of said first polarity, said zones containing a diffused region of said first polarity which extends only part way across the depth of said film, said grid isolating said zones by pairs of oppositely oriented P-N junctions and comprising a middle diffused region having a higher impurity concentration than said zones, said middle diffused region extending entirely across the depth of said film, and contiguous side diffused regions having an impurity concentration less than that of said middle diffused region, said side diffused regions separating said middle diffused region from adjacent zones and which extend substantially the same distance across the depth of said film as said diffused regions contained in said zones, said P-N junctions providing less total isolation capacitance than P-N junctions formed by a grid devoid of said side diffused regions.

3. A semiconductor circuit complex comprising a substrata wafer of semiconducting material of a first polarity having an impurity concentration of about $5 \times 10^{14}$ to $10^{16}$ atoms per cubic centimeter, and an epitaxially grown film of semiconducting material of an opposite polarity having an impurity concentration of about $10^{16}$ to $10^{17}$ atoms per cubic centimeter deposited on said substrata wafer, wherein said film is divided into zones by barriers of semiconducting material of said first polarity, said zones containing a diffused region of said first polarity which extends only part way across the depth of said film, said barriers comprising a middle diffused region having an impurity concentration of about $10^{20}$ atoms per cubic centimeter, said middle diffused region extending entirely across the depth of said film, and contiguous side diffused regions having an impurity concentration of about $10^{18}$ atoms per cubic centimeter, said side diffused regions separating said middle diffused region from adjacent zones and which extend substantially the same distance across the depth of said film as said diffused regions contained in said zones, whereby oppositely oriented P-N junctions of high resistivity are provided for electrical isolation of said zones from each other, said P-N junctions providing less total isolation capacitance than P-N junctions formed by barriers devoid of said side diffused regions.

References Cited

UNITED STATES PATENTS 3,260,902 7/1966 Porter ------------- 317—235

3,229,119 1/1966 Bohn et al. -------- 307—88.5

JOHN W. HUCKERT, *Primary Examiner.*

R. F. SANDLER, *Assistant Examiner.*